US011189905B2

(12) United States Patent
Gu et al.

(10) Patent No.: US 11,189,905 B2
(45) Date of Patent: Nov. 30, 2021

(54) INTEGRATED ANTENNA ARRAY PACKAGING STRUCTURES AND METHODS

(71) Applicant: International Business Machines Corporation, Armonk, NY (US)

(72) Inventors: Xiaoxiong Gu, Scarsdale, NY (US); Duixian Liu, Scarsdale, NY (US); Christian W. Baks, Pleasant Valley, NY (US); Alberto Valdes Garcia, Chappaqua, NY (US)

(73) Assignee: International Business Machines Corporation, Armonk, NY (US)

( * ) Notice: Subject to any disclaimer, the term of this patent is extended or adjusted under 35 U.S.C. 154(b) by 371 days.

(21) Appl. No.: 15/953,075

(22) Filed: Apr. 13, 2018

(65) Prior Publication Data
US 2019/0319338 A1 Oct. 17, 2019

(51) Int. Cl.
*H01Q 1/22* (2006.01)
*H01L 23/66* (2006.01)
(Continued)

(52) U.S. Cl.
CPC ....... *H01Q 1/2283* (2013.01); *H01L 21/4853* (2013.01); *H01L 21/4857* (2013.01); (Continued)

(58) Field of Classification Search
CPC .... H01Q 1/2283; H01Q 21/06; H01Q 21/061; H01Q 21/062; H01Q 21/064;
(Continued)

(56) References Cited

U.S. PATENT DOCUMENTS 6,575,604 B2  6/2003 Lui
7,236,666 B2  6/2007 Towle et al.
(Continued)

FOREIGN PATENT DOCUMENTS

CN  1716695 A   1/2006
CN  106207492 A  12/2016
(Continued)

OTHER PUBLICATIONS

AA. Baks et al. "Wireless Communications Package With Integrated Antenna Array", U.S. Appl. No. 15/368,600, filed Mar. 12, 2016.
(Continued)

*Primary Examiner* — Andrea Lindgren Baltzell
*Assistant Examiner* — Patrick R Holecek
(74) *Attorney, Agent, or Firm* — Kunzler Bean & Adamson

(57) ABSTRACT

An apparatus includes an antenna array package cover comprising a radiating surface, a mating surface disposed opposite the radiating surface, and an array of antenna array sub-patterns wherein each antenna array sub-pattern comprises at least one antenna element. The antenna array package also includes an array of sub-pattern interface packages mated to the mating surface of the antenna array package cover. Each sub-pattern interface package of the array of sub-pattern interface packages comprises a package carrier, a sub-pattern integrated circuit electrically and mechanically coupled to the package carrier, and a set of interface lines corresponding to the antenna elements of the antenna array sub-pattern that corresponds to the sub-pattern interface package. Methods for mounting the above apparatus into a host circuit are also disclosed herein.

20 Claims, 6 Drawing Sheets

(51) Int. Cl.

| | |
|---|---|
| *H01Q 21/06* | (2006.01) |
| *H01L 21/66* | (2006.01) |
| *H01L 23/367* | (2006.01) |
| *H01L 23/538* | (2006.01) |
| *H01L 23/00* | (2006.01) |
| *H01L 21/48* | (2006.01) |
| *H01Q 21/00* | (2006.01) |

(52) U.S. Cl.
CPC .......... *H01L 22/32* (2013.01); *H01L 23/3672* (2013.01); *H01L 23/5383* (2013.01); *H01L 23/5386* (2013.01); *H01L 23/5389* (2013.01); *H01L 23/66* (2013.01); *H01L 24/16* (2013.01); *H01Q 21/0087* (2013.01); *H01Q 21/061* (2013.01); *H01L 2223/6616* (2013.01); *H01L 2223/6677* (2013.01); *H01L 2224/16227* (2013.01); *H01L 2224/16265* (2013.01); *H01L 2924/15321* (2013.01); *H01L 2924/15323* (2013.01); *H01L 2924/1904* (2013.01); *H01L 2924/19104* (2013.01)

(58) Field of Classification Search
CPC .. H01Q 21/065; H01Q 21/00; H01Q 21/0006; H01Q 21/0025; H01Q 21/0075; H01Q 21/0081; H01Q 21/08; H01Q 21/10; H01Q 21/12; H01Q 21/22; H01Q 21/24; H01Q 21/245; H01Q 21/28; H01Q 21/29; H01Q 21/293; H01Q 21/296; H01Q 1/40; H01Q 1/405; H01L 21/4853; H01L 21/4857; H01L 22/32; H01L 23/3672; H01L 23/5383; H01L 23/5386; H01L 23/5389; H01L 23/66; H01L 24/16; H01L 2223/6616; H01L 2223/6677; H01L 2224/16227; H01L 2224/16265; H01L 2924/15321; H01L 2924/15323; H01L 2924/1904; H01L 2924/19104
See application file for complete search history.

(56) References Cited

U.S. PATENT DOCUMENTS

| | | | |
|---|---|---|---|
| 7,671,696 B1 * | 3/2010 | Puzella | H01Q 21/0087 333/33 |
| 7,675,465 B2 * | 3/2010 | Doan | H01Q 1/38 343/700 MS |
| 7,696,930 B2 | 4/2010 | Akkermans et al. | |
| 7,852,281 B2 | 12/2010 | Choudhury | |
| 8,648,454 B2 | 2/2014 | Liu et al. | |
| 8,816,929 B2 | 8/2014 | Kam et al. | |
| 8,952,521 B2 * | 2/2015 | Wojnowski | H01L 23/49816 257/675 |
| 8,988,299 B2 | 3/2015 | Kam et al. | |
| 9,196,951 B2 | 11/2015 | Baks et al. | |
| 9,203,159 B2 | 12/2015 | Friedman et al. | |
| 9,245,858 B2 | 1/2016 | Han et al. | |
| 9,331,030 B1 | 5/2016 | Tsai et al. | |
| 9,413,079 B2 | 8/2016 | Kamgaing et al. | |
| 9,531,087 B2 | 12/2016 | Ying | |
| 9,537,224 B2 | 1/2017 | Friedman et al. | |
| 9,620,464 B2 * | 4/2017 | Baks | H01L 23/49827 |
| 9,659,904 B2 | 5/2017 | Kamgaing et al. | |
| 10,074,900 B2 * | 9/2018 | Navarro | H01Q 3/267 |
| 2009/0153428 A1 | 1/2009 | Rofougaran et al. | |
| 2011/0285606 A1 | 11/2011 | De Graauw et al. | |
| 2012/0188138 A1 | 7/2012 | Liu | |
| 2012/0280380 A1 | 11/2012 | Kamgaing | |
| 2014/0145883 A1 | 5/2014 | Baks et al. | |
| 2015/0340765 A1 | 11/2015 | Dang et al. | |
| 2016/0049723 A1 | 2/2016 | Baks et al. | |
| 2016/0218072 A1 | 7/2016 | Liao et al. | |
| 2016/0240492 A1 | 8/2016 | Wolter et al. | |
| 2017/0062908 A1 | 3/2017 | Sanderovich et al. | |
| 2017/0237180 A1 | 8/2017 | Corman et al. | |
| 2020/0185299 A1 * | 6/2020 | Chang | H01L 24/19 |

FOREIGN PATENT DOCUMENTS

| | | |
|---|---|---|
| GB | 2458656 A | 9/2009 |
| JP | 2003309483 A | 10/2003 |
| WO | 2017121477 A1 | 7/2017 |

OTHER PUBLICATIONS

Anokiwave, 5G Active Antenna Innovator's Kit, AWMF-0129-IK, www.anokiwave.com, downloaded and known about as early as Mar. 13, 2018.

M. Dreiza et al., "High Density PoP (Package-on-Package) and Package Stacking Development", Electronic Components and Technology Conference, 2007, pp. 1397-1402.

T. Sowlati et al., "A 60GHz 144-Element Phased-Array Transceiver with 51dBm Maximum EIRP and ±60° Beam Steering for Backhaul Application", ISSCC 2018, Session 4, mm-Wave Radios for 5G and Beyond, 4.2, 2018 IEEE International Solid-State Circuits Conference, Feb. 12, 2018, pp. 66-68.

J.D. Dunworth, "A 28GHz Bulk-CMOS Dual-Polarization Phased-Array Transceiver with 24 Channels for 5G User and Basestation Equipment", ISSCC 2018 / Session 4 / mm-Wave Radios for 5G and Beyond / 4.4, 2018 EEE International Solid-State Circuits Conference, Feb. 12, 2018, pp. 70-72.

S. Shahramian et al., A Fully Integrated Scalable W-Band Phased-Array Module with Integrated Antennas, Self-Alignment and Self-Test, ISSCC 2018 / Session 4 / mm-Wave Radios for 5G and Beyond / 4.6, 2018 IEEE International Solid-State Circuits Conference, Feb. 12, 2018, pp. 74-76.

D.Hu et al., "A PoP Structure to Support I/O over 1000", 2013 Electronic Components & Technology Conference, 2013, pp. 412-416.

Z. Yang, et al., "Investigation of PoP package structure with copper pillar replace the solder ball", 2015 16th International Conference on Electronic Packaging Technology, 2015, pp. 634-637.

PCT/IB2010/051750, "Notification of Transmittal of the International Search Report and the Written Opinion of the International Searching Authority, or the Declaration", PCT International Searching Authority, dated Jul. 3, 2019, pp. 1-9.

* cited by examiner

Cover with 2x2 array of 6x6 sub-arrays

Cover with 1x5 array of 6x6 sub-arrays

Cover with 2x3 array of 6x6 sub-arrays

INTEGRATED ANTENNA ARRAY PACKAGING STRUCTURES AND METHODS

BACKGROUND

The subject matter disclosed herein relates generally to wireless device package structures and, in particular, to techniques for packaging antenna array structures with semiconductor chips such as mm Wave RF integrated circuits to form compact integrated wireless communication systems.

When constructing wireless communications package structures with integrated antenna arrays, it is important to implement package designs that provide proper antenna characteristics (e.g., high efficiency, wide bandwidth, good radiation characteristics, etc.) and array configurability (e.g., antenna elements in rows and columns), while providing low-cost and reliable package solutions.

Typical approaches to packaging wireless communication systems include creating a single package or modular packaging. Using a single package requires creating a complete custom package for each possible antenna configuration that may be needed. Such an approach increases upfront design costs, manufacturing rework costs and inventory costs. Modular packaging reduces the aforementioned costs but degrades the uniformity and/or placement precision of the antenna elements of large antenna arrays relative to each other and thereby reduces antenna performance.

SUMMARY OF THE INVENTION

In one embodiment, an apparatus includes an antenna array package cover comprising a radiating surface, a mating surface disposed opposite the radiating surface, and an array of antenna array sub-patterns wherein each antenna array sub-pattern comprises at least one antenna element. The antenna array package also includes an array of sub-pattern interface packages mated to the mating surface of the antenna array package cover. In some embodiments, each sub-pattern interface package of the array of sub-pattern interface packages comprises a package carrier; a sub-pattern integrated circuit electrically, and mechanically, coupled to the package carrier; and a set of interface lines corresponding to the antenna elements of the antenna array sub-pattern that corresponds to the sub-pattern interface package.

In some embodiments, each sub-pattern interface package of the array of sub-pattern interface packages is disposed below a corresponding antenna array sub-pattern of the array of antenna array sub-patterns. The sub-pattern integrated circuit may be flip-chip bonded to the package carrier and the antenna array package including the package carrier can be mounted on a host circuit. For example, the antenna array package may be mounted on the host circuit via a ball grid array (BGA) or a land grid array (LGA) socket. In certain embodiments, the host circuit comprises one or more heat sinks that are thermally connected to the plurality of sub-pattern integrated circuits via a plurality of thermal conduits.

Methods for mounting the above apparatus into a host circuit are also disclosed herein. In one embodiment, a first method includes providing the antenna array package cover, providing the sub-pattern interface packages, mating the plurality of sub-pattern interface packages to the mating surface of the antenna array package cover to produce an antenna array package and mounting the antenna array package onto a host circuit. In one embodiment, a second method includes providing the antenna array package cover, providing the sub-pattern interface packages and mounting the plurality of sub-pattern interface packages onto a host circuit. The second method also includes mating the plurality of sub-pattern interface packages to the mating surface of the antenna array package cover subsequent to mounting the plurality of sub-pattern interface packages onto the host circuit.

The above described apparatus and methods enable providing wireless communication systems with reduced upfront design costs, manufacturing rework costs and inventory costs without degrading the uniformity and placement precision of the antenna elements used by those systems.

BRIEF DESCRIPTION OF THE DRAWINGS

In order that the advantages of the embodiments of the invention will be readily understood, a more particular description of the embodiments briefly described above will be rendered by reference to specific embodiments that are illustrated in the appended drawings. Understanding that these drawings depict only some embodiments and are not therefore to be considered to be limiting of scope, the embodiments will be described and explained with additional specificity and detail through the use of the accompanying drawings, in which.

DETAILED DESCRIPTION OF THE INVENTION

Reference throughout this specification to "one embodiment," "an embodiment," or similar language means that a particular feature, structure, or characteristic described in connection with the embodiment is included in at least one embodiment. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Figure 1A:
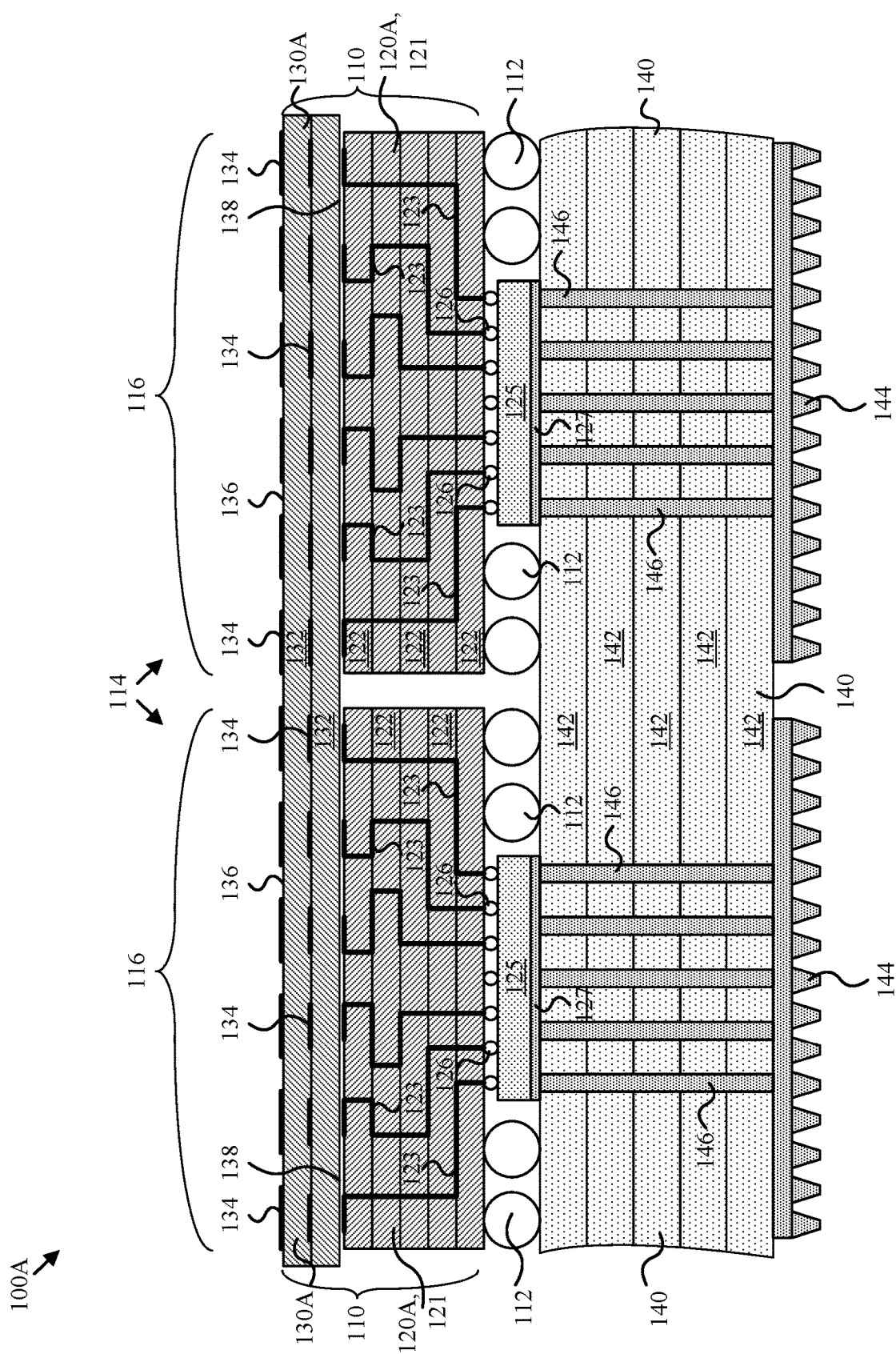
FIGS. 1A, 1B, and 1C are cross-sectional view illustrations of several examples of antenna array packages in accordance with one or more embodiments disclosed herein.
Figure 1B:
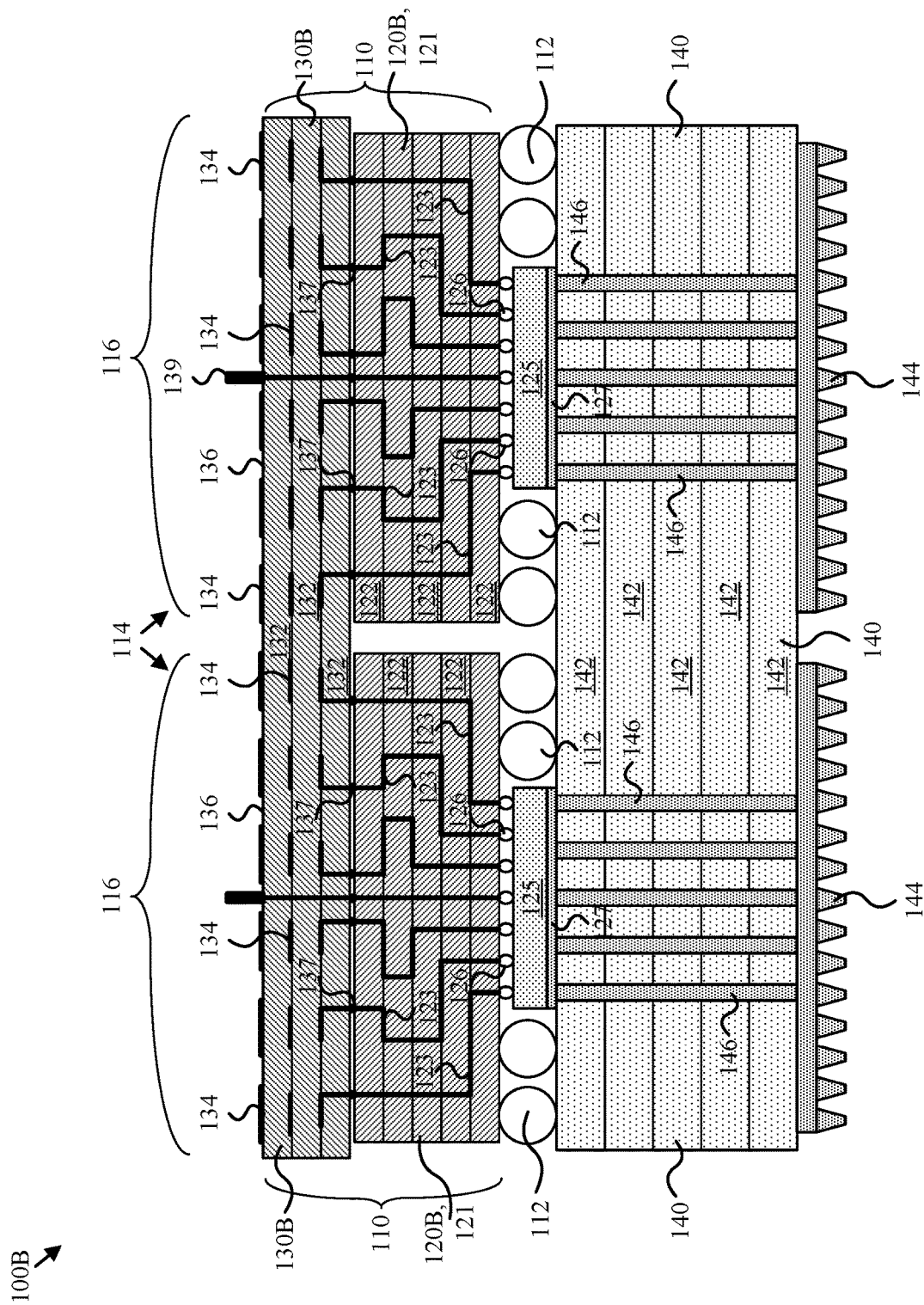
Figure 1C:
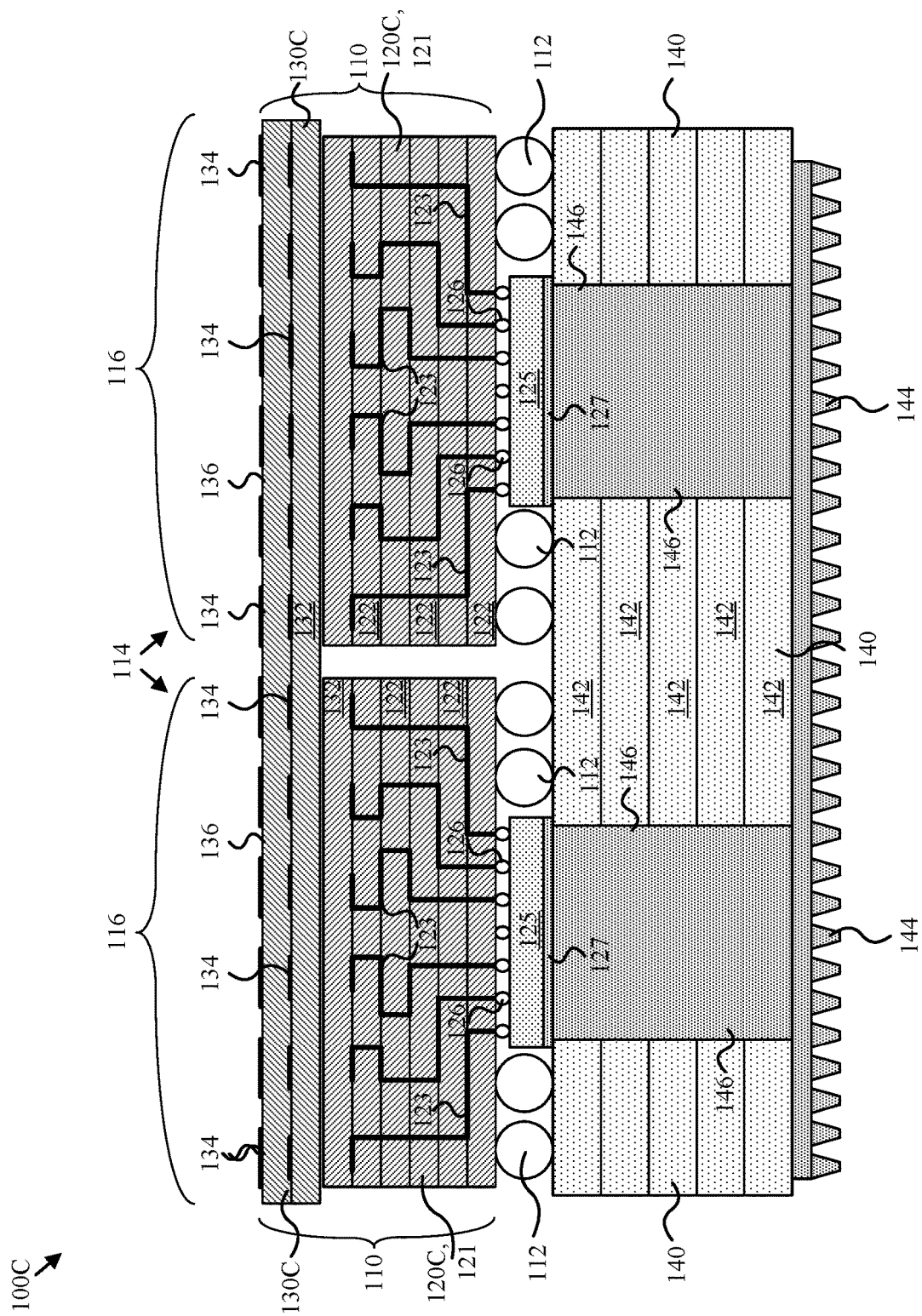

FIGS. 1A, 1B, and 1C are cross-sectional view illustrations of several examples of an antenna array system 100 in accordance with one or more embodiments disclosed herein. As depicted, the antenna array system 100 includes an antenna array package 110 comprising multiple sub-pattern interface packages 120 mated with an antenna array package cover 130. The antenna array package 110 may be mounted on a host circuit 140. The antenna array system 100 enables compact cost-effective integration of large antenna array structures with wireless circuits that interface to the antenna array structures.

The antenna array package 110 may include a set of host circuit connectors 112 that provide electrical and/or mechanical connections to the host circuit 140. In the depicted embodiment, the host circuit connectors 112 comprise an array of solder balls (BGA) with controlled diameter and height.

The antenna array package 110 includes one or more antenna arrays 114 formed on the antenna array package cover 130 that may be used to transmit and/or receive electromagnetic signals such as mm Wave signals. In the depicted embodiment, the antenna array package 110 includes a single antenna array 114 comprising antenna elements 134 formed by one or more conductive structures placed on one or more package layers 132 of the antenna array package cover 130. For example, the antenna elements 134 could correspond to different types of antennas such as microstrip antennas; (e.g., patch and inverted-F antennas) stacked patch antennas; loop antennas; dipole antennas; bow-tie antennas; fractal antennas; slot antennas; traveling wave antennas, such as helical, spiral, and yagi-uda antennas; reflector antennas; and the like.

The sub-pattern interface packages 120 may provide signals to, and/or receive signals from, the antenna arrays 114 via a set of antenna feeds 123. In the depicted embodiments, each sub-pattern interface package 120 includes antenna feeds 123 that correspond to a subset of the antenna elements 134, referred to herein as an antenna array sub-pattern 116. In some embodiments, each sub-pattern interface package 120 is disposed below a corresponding antenna array sub-pattern 116. Disposing each interface package 120 below the corresponding antenna array sub-pattern 116 shortens the signal path between package 120 and the corresponding antenna elements 134 and may improve performance. Furthermore, placing the antenna array sub-patterns 116 on the antenna array package cover 130 and above the corresponding sub-pattern interface packages 120, enables adjacent placement of multiple antenna array sub-patterns 116 and thereby reduces the surface area of the antenna array system 100. In some embodiments, each antenna array sub-pattern 116 is a sub-array of the antenna array 114.

In the depicted embodiments, each sub-pattern interface package 120 includes a package carrier 121 comprising multiple package layers 122 that may be used to route the antenna feeds 123 connected to one or more sub-pattern integrated circuits 125 via one or more chip connectors 126. The chip connectors 126 may comprise C4 solder balls that are smaller in scale than the solder balls of the host circuit connectors 112. The integrated circuits 125 may interface with the antenna elements 134 via the antenna feeds 123 and provide other functions such as frequency conversion functions and amplitude and/or phase control functions for each antenna element 134.

In some embodiments, the package carrier 121 and/or the antenna array package cover 130 comprises a multilayer organic carrier that can be constructed using known carrier fabrication technologies, such as SLC (surface laminar circuit), HDI (high density interconnect), or other carrier fabrication techniques that enable the formation of organic-based multilayered circuit boards with high integration density. With these carrier fabrication techniques, a carrier substrate can be formed from a stack of laminated layers comprising alternating layers of metallization and dielectric/insulator materials, wherein the metallization layers are separated from overlying and/or underlying metallization layers by a respective layer of dielectric/insulating material. The metallization layers can be formed of copper and the dielectric/insulating layers can be formed of organic buildup and core materials. Other types of materials can be used for the metallization and insulating layers of the package carrier 121 and/or the antenna array package cover 130 such as LCP (liquid crystal polymer), glass, or LTCC (low-temperature co-fired ceramic). Moreover, these technologies enable the formation of small conductive vias (e.g., partial or buried vias between adjacent metallization layers) using laser ablation, photo imaging, or etching, for example, to enable the formation of high density wiring and interconnect structures within the carrier substrate.

The sub-pattern integrated circuits 125 may comprise a metallization pattern (not specifically shown) formed on the chip connector side (top side as shown) of each chip. The metallization pattern may include bonding/contact pads upon which the chip connectors 126 are formed. The bonding/contact pads may include, for example, ground pads, DC power supply pads, input/output pads, control signal pads, associated wiring, etc., that are formed as part of a BEOL (back end of line) wiring structure of the sub-pattern integrated circuits 125.

Each sub-pattern integrated circuit 125 may be electrically and mechanically connected to a particular sub-pattern interface package 120 and thereby the antenna array package 110 via flip-chip bonding (during which the orientation of the sub-pattern interface package 120 may be flipped from what is shown). Depending on the application, the sub-pattern integrated circuits 125, either individually or collectively, may include RF circuitry and electronic components formed thereon including, for example, a receiver, a transmitter or a transceiver circuit, and other active or passive circuit elements that are commonly used to implement wireless RF chips.

The antenna array package cover 130 may include a radiating surface 136 from which electromagnetic radiation is preferably emitted and a mating surface 138 used for mating the antenna array package cover 130 to the sub-pattern interface packages 120. In some embodiments, the antenna array package cover 130 is mated to the sub-pattern interface package 120 generally, and the package carrier 121 specifically, using an epoxy adhesive or some other adhesive material. Alternately, the antenna array package cover 130 may be mated to the sub-pattern interface packages 120 via fasteners (see, for example, FIGS. 3A-3C) or via solder balls (not shown) and a solder reflow process.

The host circuit 140 may include multiple circuit layers 142 that can be used to route signals traces between the host circuit connectors 112 and components that are mounted on portions of the host circuit 140 that are not shown in the depicted examples. In some embodiments, a thermal connection layer 127 is disposed between the host circuit 140 and each sub-pattern integrated circuit 125. The thermal connection layer 127 may thermally couple the non-active surface (bottom surface as shown) of sub-pattern integrated circuit 125 to a region of the host circuit 140 that is aligned to a heat sink 144 and one or more thermal conduits 146 (e.g., metal filled vias or a pedestal). The thermal connection layer 127 serves to transfer heat from the sub-pattern integrated circuit 125 to the thermal conduits 146 which transfer the heat to the heat sink 144 for thermal dissipation (e.g., via conduction, convection, and radiation).

One of skill in the art will appreciate that the antenna elements 134 may be coupled to the antenna feeds 123 via a variety of antenna feed structures including structures known by those of skill in the art such as aperture coupled structures and microstrip feed coupled structures. The antenna feed structures may be disposed within or on the surface the antenna array package cover 130 and/or the sub-pattern interface packages 120. For example, FIGS. 1A and 1C depict embodiments where the antenna feed structures are located entirely within the sub-pattern interface packages 120. In contrast, FIG. 1B depicts an embodiment where at least a portion of the antenna feed structures are located in the antenna array package cover 130. In the depicted embodiment, the antenna feeds 123 cross from the sub-pattern interface packages 120 into the antenna array package cover 130 via connection elements 137.

Examples of possible connection elements 137 include package-on-package interconnects such as pillars. Some of the connection elements 137 may be connected to test pins 139 to enable testing of the sub-pattern integrated circuits 125. In another embodiment, not show, the connection elements 137 may be connected to microstrip feedline structures that make direct connection to the antenna elements 134. In another embodiment, not shown, all connection elements 137 are connected to external test pins 139, forming an alternate version of the package cover that supports connectorized measurements for test purposes. Such testing may facilitate rework of assembled antenna array packages 110 and reduce manufacturing losses.

Figure 2A:
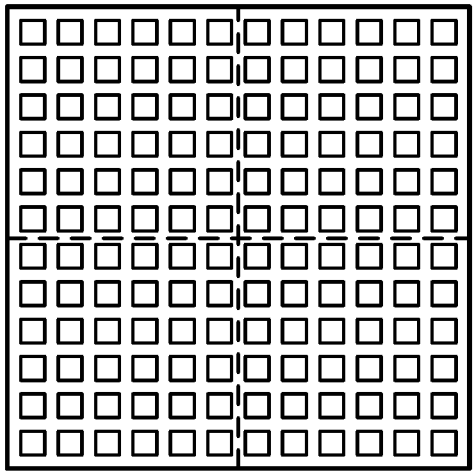
FIGS. 2A, 2B, and 2C are plan view illustrations of several examples of antenna array covers in accordance with one or more embodiments disclosed herein.
Figure 2B:
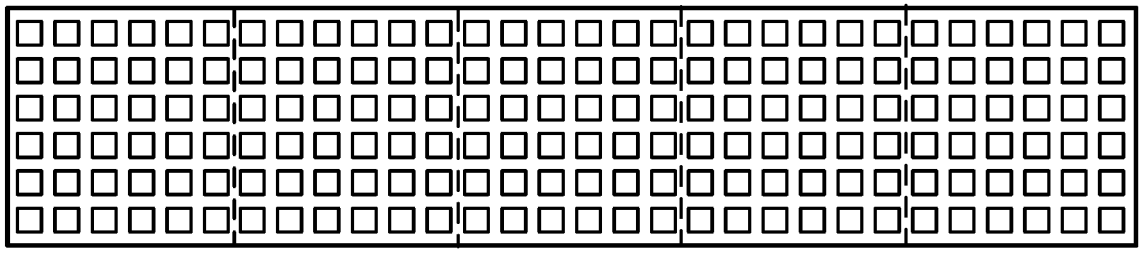
Figure 2C:
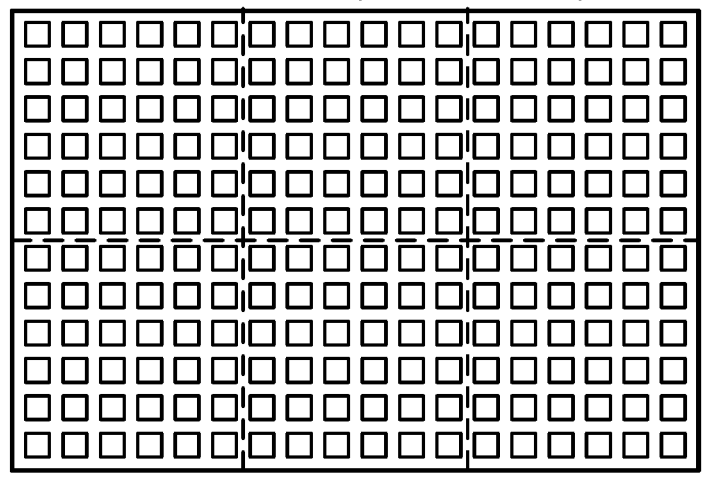

FIGS. 2A, 2B and 2C are plan view illustrations of several examples of antenna array covers 130 in accordance with one or more embodiments disclosed herein. As depicted, the antenna array covers 130 include a 2×2 (i.e., 2 rows and 2 columns) configuration 200A, a 1×5 (i.e., 1 row and 5 columns) configuration 200B, and a 2×3 (i.e., 2 rows and 3 columns) configuration 200C. In the depicted examples, the row and column boundaries are indicated with dashed lines for clarity. Each configuration is mated with a set of sub-pattern interface packages 120 where the number of packages in the set is equal to the product of the number of rows and the number of columns of the particular configuration.

One of skill in the art will appreciate that providing the antenna array package 110 by mating multiple sub-pattern interface packages 120 with an antenna array package cover 130 that corresponds to the desired antenna array size reduces the complexity of providing antenna arrays of various sizes (such as those depicted in FIGS. 2A-2C). Furthermore, signal routing on or within the antenna array package cover 130 may be simplified in that the signal routing pattern of antenna array package covers 130 of various sizes may use a common unit cell that is used (i.e., repeated) for each array sub-pattern 116 within the antenna array 114. Furthermore, size and spacing uniformity of the antenna elements 134 can be achieved with the common antenna array cover 130.

Figure 3A:
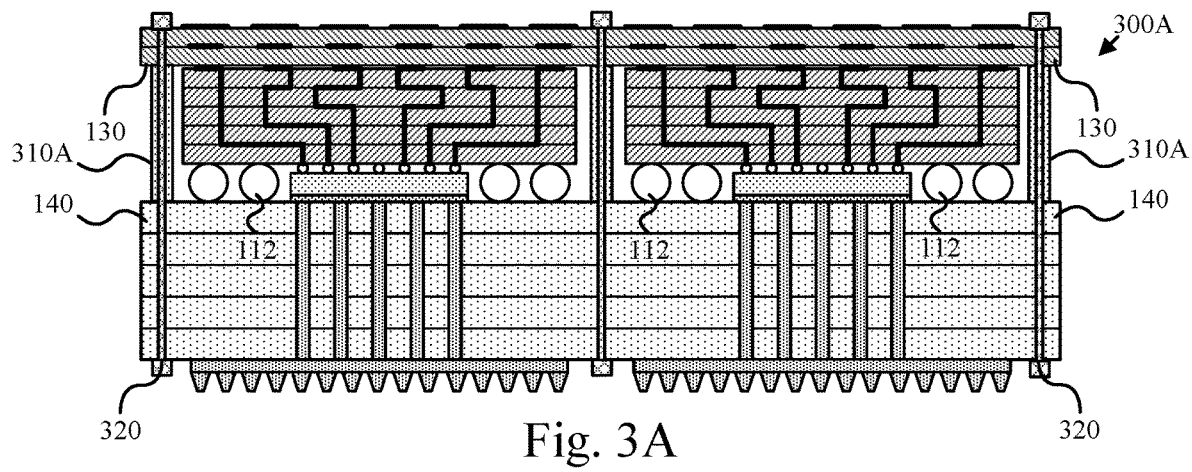
FIGS. 3A, 3B and 3C are cross-sectional view illustrations of several examples of antenna array packages with spacer frames in accordance with one or more embodiments disclosed herein.
Figure 3B:
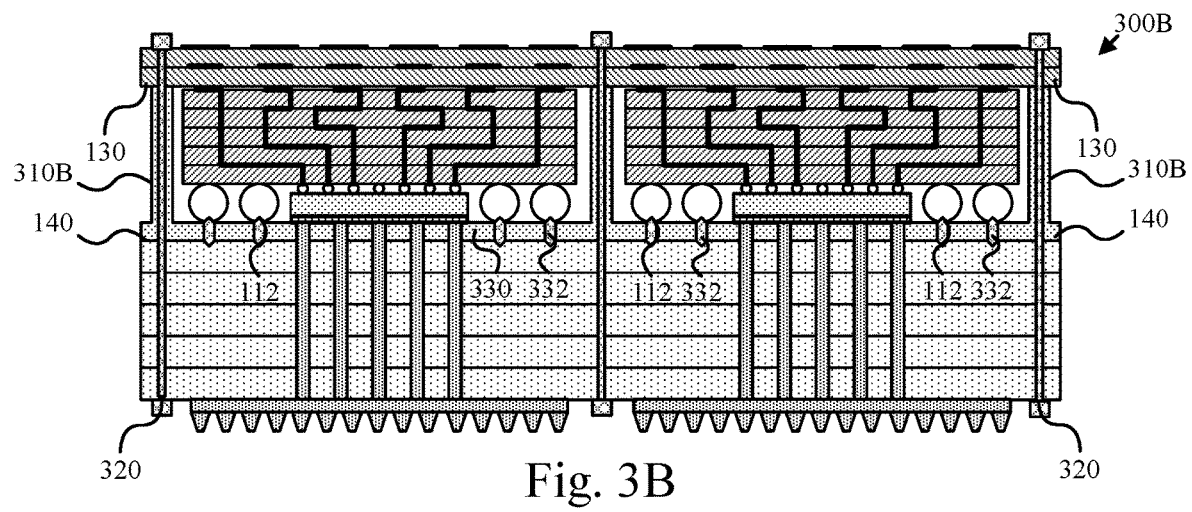
Figure 3C:
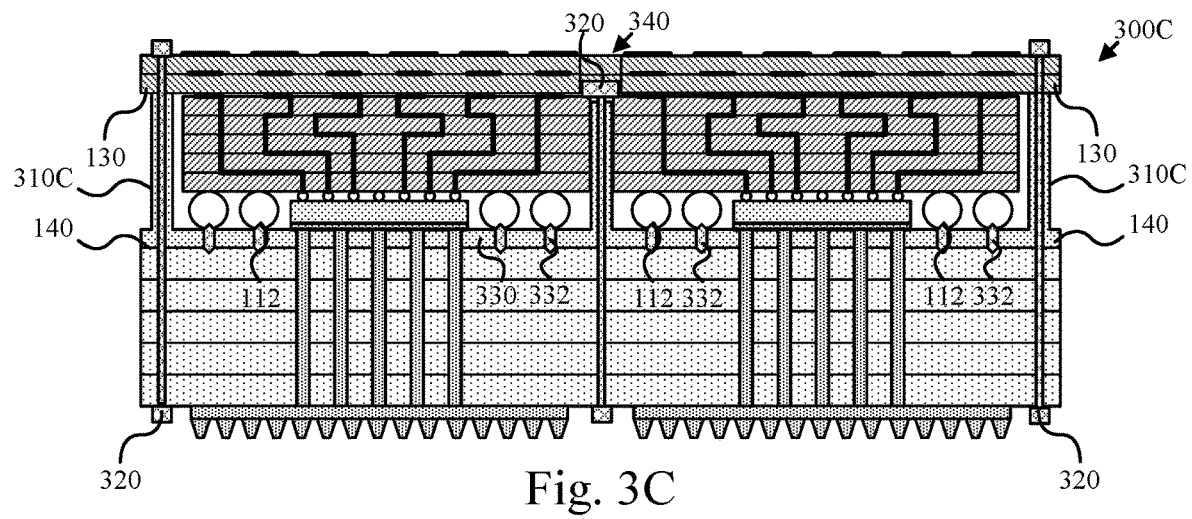

FIGS. 3A, 3B, and 3C are cross-sectional view illustrations of several examples of antenna array packages 300 in accordance with one or more embodiments disclosed herein. Each depicted example includes a single spacer frame 310 with fasteners 320 that secure the spacer frame between the antenna array package cover 130 and the host circuit 140. The fasteners 320 may comprise a variety of fastening means such as pins, rivets, screws, bolts, nuts, or the like.

FIG. 3A depicts an antenna array package 300A with a spacer frame 310A and BGA circuit connectors 112 that connect directly to the host circuit 140 as shown in previous figures. FIG. 3B depicts an antenna array package 300B with a spacer frame 310B and an LGA interposer 330 disposed between the circuit connectors 112 and the host circuit 140. A set of pins 332 ensures an electrical connection between the circuit connectors 112 and the host circuit 140. In the depicted embodiment, the LGA interposer 330 is integral to the spacer frame 310B. FIG. 3C depicts an antenna array package 300C with a multi-level spacer frame 310C and length fasteners 320 of multiple lengths and an LGA interposer 330 integral to the spacer frame 310C. The multi-level spacer frame 310C enables direct securement of the package carriers 121 via an aperture 340 in the antenna array cover 130 and a fastener 320 disposed therein.

Figure 4A:
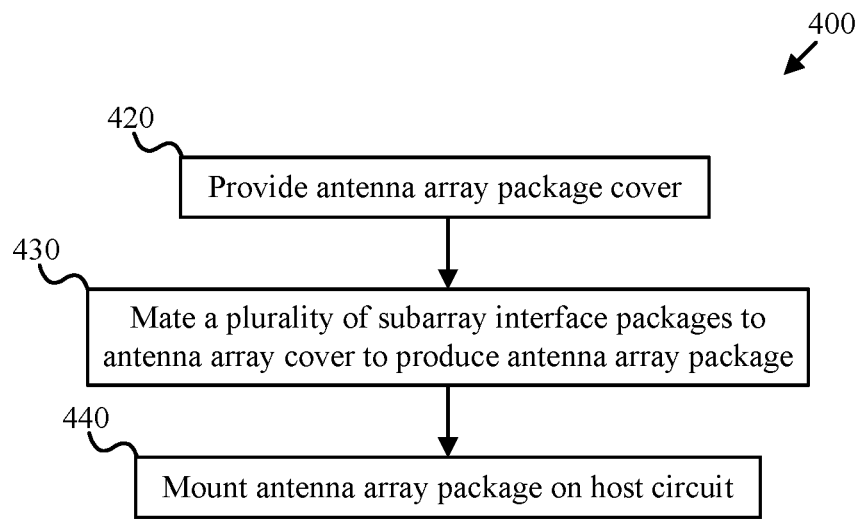
FIGS. 4A and 4B are flowcharts of two examples of an antenna system fabrication method in accordance with one or more embodiments disclosed herein.
Figure 4B:
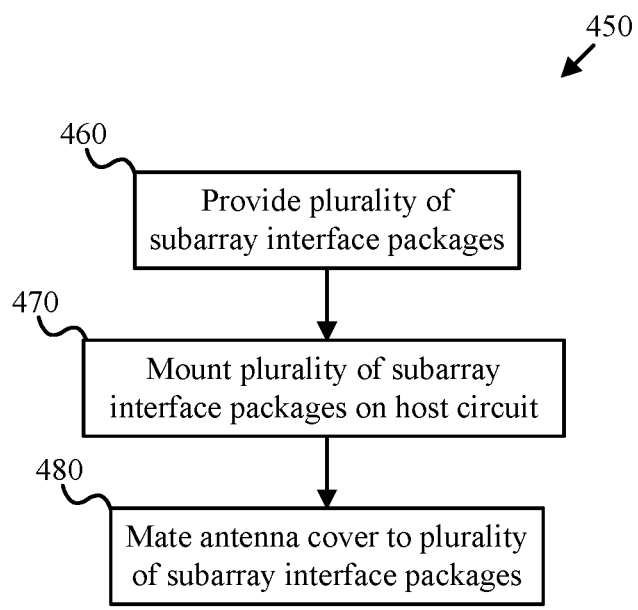

FIGS. 4A and 4B are flowcharts of two examples of an antenna system fabrication method 400 in accordance with one or more embodiments disclosed herein. A first example 400A, shown in FIG. 4A, includes providing 410 the antenna array package cover, mating 420 a plurality of sub-pattern interface packages to the mating surface of the antenna array package cover to produce an antenna array package and mounting 430 the antenna array package onto a host circuit. The depicted embodiment essentially uses the cover as a substrate for building an antenna package that is mounted to the host PCB.

A second example 400B of the antenna system fabrication method 400 includes providing 460 the sub-pattern interface packages and mounting 470 the plurality of sub-pattern interface packages onto a host circuit. The second example also includes mating 480 the plurality of sub-pattern interface packages to the mating surface of the antenna array package cover subsequent to mounting the plurality of sub-pattern interface packages onto the host circuit. The depicted embodiment essentially mounts multiple sub-pattern interface packages (carrier+ RFIC) to a host PCB and covers the sub-pattern interface packages with a common antenna cover.

One of skill in the art will appreciate that the embodiments disclosed herein provide a modular approach to packaging wireless communication systems that reduces upfront design costs, manufacturing rework costs and inventory costs without degrading the uniformity and placement precision of the antenna elements of large antenna arrays relative to each other and without reducing antenna performance.

The features, advantages, and characteristics of the embodiments described herein may be combined in any suitable manner. One skilled in the relevant art will recognize that the embodiments may be practiced without one or more of the specific features or advantages of a particular embodiment. In other instances, additional features and advantages may be recognized in certain embodiments that may not be present in all embodiments.

Reference throughout this specification to "one embodiment," "an embodiment," or similar language means that a particular feature, structure, or characteristic described in connection with the embodiment is included in at least one embodiment. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

The schematic flowchart diagrams and/or schematic block diagrams in the Figures illustrate the architecture, functionality, and operation of possible implementations. It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. Although various arrow types and line types may be employed in the flowchart and/or block diagrams, they are understood not to limit the scope of the corresponding embodiments. Indeed, some arrows or other connectors may be used to indicate only an exemplary logical flow of the depicted embodiment.

The description of elements in each figure may refer to elements of proceeding figures. Like numbers refer to like elements in all figures, including alternate embodiments of like elements. The embodiments may be practiced in other specific forms. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An apparatus comprising:
   an antenna array package cover comprising:
     a radiating surface forming a top surface of the antenna array package cover,
     a mating surface disposed opposite the radiating surface and forming a bottom surface of the antenna array package cover, and
     an array of antenna array sub-patterns disposed on the radiating surface,
     wherein each antenna array sub-pattern of the array of antenna array of sub-patterns comprises at least one antenna element disposed on the radiating surface; and
   an array of sub-pattern interface packages coupled to the mating surface of the antenna array package cover,
   wherein:
     the array of sub-pattern interface packages comprises a plurality of sub-pattern interface packages,
     each sub-pattern interface package of the array of sub-pattern interface packages comprises:
       a package carrier,
       a sub-pattern integrated circuit electrically and mechanically coupled to the package carrier, and
       a set of interface lines corresponding to the at least one antenna element of the antenna array sub-pattern that corresponds to the sub-pattern interface package,
     disposing the array of sub-pattern interface packages below the array of antenna array sub-patterns shortens a signal path between each sub-pattern interface pattern and a corresponding antenna element, and
     disposing the array of antenna array sub-patterns on the antenna array package cover above the array of sub-pattern interface packages allows adjacent placement of the plurality of sub-pattern interface packages to reduce a surface area of the apparatus.

2. The apparatus of claim 1, wherein the sub-pattern integrated circuit is flip-chip bonded to the package carrier.

3. The apparatus of claim 1, wherein the antenna array package cover and the array of sub-pattern interface packages form an antenna array package.

4. The apparatus of claim 3, wherein the antenna array package is mounted on a host circuit.

5. The apparatus of claim 4, wherein the antenna array package is mounted on the host circuit via a ball grid array (BGA) or a land grid array (LGA) socket.

6. The apparatus of claim 4, wherein the host circuit comprises one or more heat sinks that are thermally connected to the plurality of sub-pattern integrated circuits via a plurality of thermal conduits.

7. The apparatus of claim 6, wherein a thermal conduit of the one or more thermal conduits comprises a pedestal.

8. The apparatus of claim 4, further comprising a spacer frame disposed between the antenna array package cover and the host circuit.

9. The apparatus of claim 1, wherein the antenna array package cover comprises a set of antenna feeds for each antenna array sub-pattern of the array of antenna array sub-patterns.

10. The apparatus of claim 1, wherein the antenna array package cover comprises a test interface element that is electrically connected to at least one sub-pattern integrated circuit.

11. The apparatus of claim 1, wherein the array of sub-pattern interface packages are secured to the mating surface of the antenna array package cover via one or more of supporting balls, an adhesive, and at least one fastener.

12. The apparatus of claim 1, wherein the antenna array package cover or the package carrier comprises multiple layers.

13. The apparatus of claim 1, wherein the package carrier comprises bonding pads for a solder ball grid array.

14. The apparatus of claim 1, wherein each antenna element comprises a patch of conductive material disposed on or below the radiating surface.

15. The apparatus of claim 1, wherein the antenna elements are disposed on multiple layers of the antenna array package cover.

16. A system, comprising:
    a plurality of antenna arrays arranged in one of a plurality of configurations, wherein each antenna array comprises:
      an antenna array package cover comprising a radiating surface forming a top surface of the antenna array package cover, a mating surface disposed opposite the radiating surface and forming a bottom surface of the antenna array package cover, and an array of antenna array sub-patterns disposed on the radiating surface, wherein each antenna array sub-pattern of the array of antenna array of sub-patterns comprises at least one antenna element disposed on the radiating surface; and
      an array of sub-pattern interface packages coupled to the mating surface of the antenna array package cover,
    wherein:
      the array of sub-pattern interface packages comprises a plurality of sub-pattern interface packages,
      each sub-pattern interface package of the array of sub-pattern interface packages comprises:
        a package carrier,
        a sub-pattern integrated circuit electrically and mechanically coupled to the package carrier, and
        a set of interface lines corresponding to the at least one antenna element of the antenna array sub-pattern that corresponds to the sub-pattern interface package,
      disposing the array of sub-pattern interface packages below the array of antenna array sub-patterns shortens a signal path between each sub-pattern interface pattern and a corresponding antenna element, and disposing the array of antenna array sub-patterns on the antenna array package cover above the array of sub-pattern interface packages allows adjacent placement of the plurality of sub-pattern interface packages to reduce a surface area of each antenna array.

17. The system of claim 16, wherein each sub-pattern integrated circuit comprises a flip-chip bonded to the package carrier.

18. The system of claim 16, wherein the antenna array package cover and each array of sub-pattern interface packages form an antenna array package.

19. The system of claim 16, wherein the antenna array package cover comprises a test interface element that is electrically connected to at least one sub-pattern integrated circuit.

20. The system of claim 16, wherein:

each antenna element comprises a patch of conductive material disposed on or below the radiating surface; and each of the antenna elements are disposed on multiple layers of the antenna array package cover.

\* \* \* \* \*